United States Patent
Jin (10) Patent No.: US 10,673,394 B2
(45) Date of Patent: Jun. 2, 2020

(54) POWER AMPLIFIER

(71) Applicant: Taiwan Semiconductor Manufacturing Co., Ltd., Hsin-Chu (TW)

(72) Inventor: Jun-De Jin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/041,346

(22) Filed: Jul. 20, 2018

(65) Prior Publication Data

US 2018/0331663 A1 Nov. 15, 2018

Related U.S. Application Data

(63) Continuation of application No. 15/204,734, filed on Jul. 7, 2016, now Pat. No. 10,050,590.

(60) Provisional application No. 62/313,022, filed on Mar. 24, 2016.

(51) Int. Cl.
  *H03F 1/56* (2006.01)
  *H03F 3/193* (2006.01)
  *H03F 3/24* (2006.01)

(52) U.S. Cl.
  CPC .............. *H03F 1/565* (2013.01); *H03F 3/193* (2013.01); *H03F 3/245* (2013.01); *H03F 2200/391* (2013.01); *H03F 2200/451* (2013.01)

(58) Field of Classification Search
  USPC ................................................ 330/302–307
  See application file for complete search history.

(56) References Cited

U.S. PATENT DOCUMENTS

| 6,094,108 | A  * | 7/2000  | Suematsu ............. H03H 11/32 333/25 |
| 6,549,077 | B1   | 4/2003  | Jou |
| 6,553,216 | B1 * | 4/2003  | Pugel ....................... H03D 7/18 455/195.1 |
| 8,014,719 | B2 * | 9/2011  | Moloudi ............ H03H 11/1291 327/358 |
| 8,279,008 | B2   | 10/2012 | Hsieh et al. |
| 8,427,240 | B2   | 4/2013  | Hsieh et al. |
| 8,558,622 | B2 * | 10/2013 | Uno ......................... H03F 1/32 330/302 |
| 8,593,206 | B2   | 11/2013 | Chen et al. |
| 8,610,494 | B1   | 12/2013 | Jin et al. |
| 8,618,631 | B2   | 12/2013 | Jin et al. |
| 8,912,581 | B2   | 12/2014 | Lin et al. |
| 8,941,212 | B2   | 1/2015  | Yen et al. |

(Continued)

*Primary Examiner* — Hieu P Nguyen
(74) *Attorney, Agent, or Firm* — Duane Morris LLP (57) ABSTRACT

A power amplifier (PA) cell is coupled to an input signal source an a load, and includes a transistor coupled to the load; a first inductor coupled to a gate of the transistor; and a second inductor coupled to a source of the transistor, wherein the first inductor and the second inductor each includes a first conductive coil and a second conductive coil, respectively, having first and second inductance values, respectively, such that the power cell is coupled to the input signal source without an input impedance matching circuit disposed between the gate of the transistor and the input signal source, and without an output impedance matching circuit disposed between a drain of the transistor and the load.

20 Claims, 7 Drawing Sheets

(56) References Cited

U.S. PATENT DOCUMENTS

| | | |
|---|---|---|
| 9,184,256 B2 | 11/2015 | Huang et al. |
| 9,209,521 B2 | 12/2015 | Hung et al. |
| 2014/0015614 A1 | 1/2014 | Oliveira |
| 2014/0132333 A1 | 5/2014 | Jin et al. |
| 2014/0253262 A1 | 9/2014 | Hsieh et al. |
| 2014/0253391 A1 | 9/2014 | Yen |
| 2015/0364417 A1 | 12/2015 | Lee |

* cited by examiner

POWER AMPLIFIER

CROSS-REFERENCE TO RELATED APPLICATION

The present application is a continuation of U.S. patent application Ser. No. 15/204,734, filed on Jul. 7, 2016, which is incorporated by reference herein in its entirety. The present application claims priority to U.S. Provisional Patent Application No. 62/313,022, filed on Mar. 24, 2016, which is incorporated by reference herein in its entirety.

BACKGROUND

A radio frequency (RF) power amplifier is a type of electronic amplifier used to convert a low-power radio-frequency signal into a larger signal of significant power. The RF power amplifier typically comprises multiple power cells. Each of the power cells includes one or more power transistors designed to optimize efficiency, linearity, output, and cost of the power amplifier.

One commonly-used application of the RF power amplifier is to drive a transmitting antenna of a transmitter or transceiver of a communication device for data communication. With the increasing use of low-power applications (e.g., mobile communication devices, Bluetooth Low Energy devices, energy harvesting devices/sensors, etc.), managing power consumption and performance of an RF amplifier simultaneously to integrate the RF power amplifier into such low-power application has become very important.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

Figure 1:
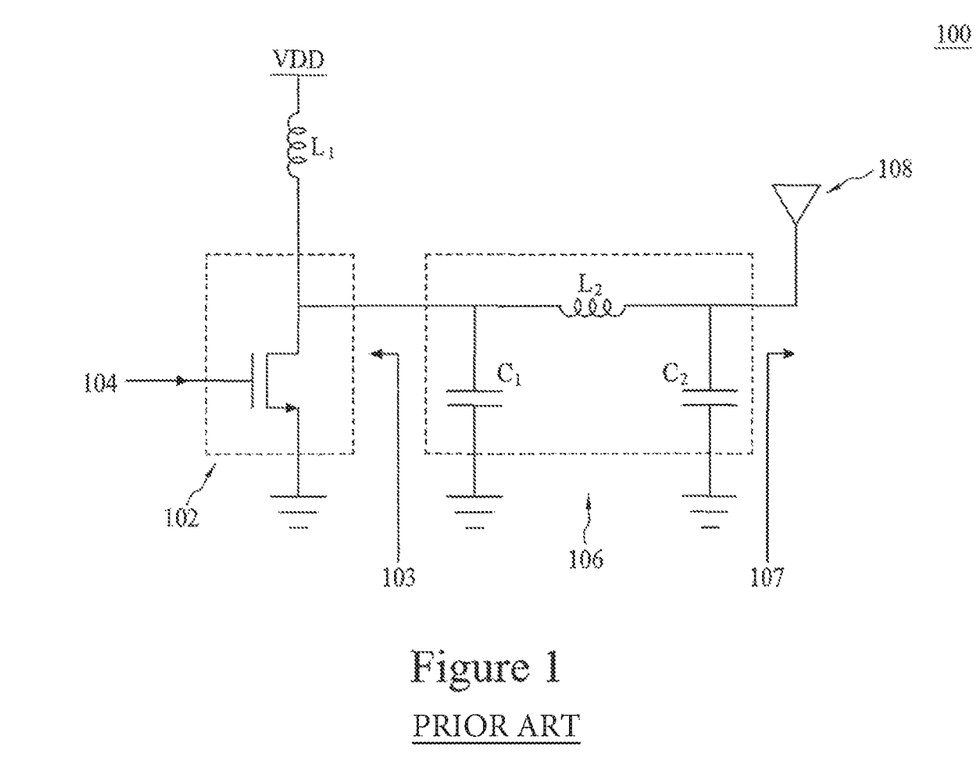
FIG. 1 illustrates an exemplary schematic diagram of a conventional power amplifier.

FIG. 1 illustrates an exemplary block diagram of an RF power amplifier 100 that includes a power cell 102, a matching circuit 106, and an antenna 108. The power cell 102 receives an input RF signal 104 and converts the input RF signal 104 to a higher power signal to drive the antenna 108 through the matching circuit 106. In the specific embodiment of the power amplifier 100 of FIG. 1, the matching circuit 106, which includes capacitors C1 and C2 and an inductor L2, is configured to match an output impedance 103 of the power cell 102 with an input impedance 107 of the antenna 108. In order to efficiently transfer power from a source (e.g., the power cell 102) to a load (e.g., the antenna 108), as shown in FIG. 1, such an impedance matching circuit is generally required to be coupled between the power cell and the load in conventional RF power amplifier designs.

Similarly, another impedance matching circuit (not shown) may be needed between an output of a source of the RF input signal 104 (e.g., an oscillator) and an input of the power cell 102, to match the source's output impedance with the input impedance of the power cell 102. Such an impedance matching circuit is typically referred to as an input matching circuit of the power amplifier 100. However, including one or more impedance matching circuits in an RF power amplifier commonly raises a variety of issues, especially if the RF power amplifier is used in low-power applications. For example, a relatively high voltage source ($V_{DD}$) is required to drive the power cell and the matching circuit, and the matching circuit itself generally consumes additional power (e.g., static power of the RF power amplifier). Additionally, incorporating a matching circuit on an integrated circuit requires the allocation of valuable "real state" on the integrated circuit.

The present disclosure provides various advantages over conventional power amplifiers by using embodiments of a novel power amplifier that require no impedance matching circuit to couple a power cell of the power amplifier to a load. Even without the impedance matching circuit coupled between the power cell and the load, the power amplifier/power cell still provides a desired output impedance (e.g., about 50 ohms ($\Omega$)) by using a nanoscale power cell in accordance with some embodiments. Additionally, by coupling an inductor to a source and a gate of the power cell, respectively, the power cell provides an input impedance of about 50 ohm (Ω) without an input matching circuit, in accordance with some embodiments. In other words, according to some embodiments, while eliminating the need to couple a matching circuit at the output of the power cell and an input matching circuit at the input of the power cell, the power cell can still provide an input and an output impedances that are both about 50Ω. Such 50Ω input/output impedances of the power cell enables a maximum amount of power transfer (e.g., from an input source to the power cell, and from the power cell to a load) in modern RF power amplifier applications. Some embodiments of the current disclosure are directed to operating the novel power cell at a frequency of about 2.4 GHz but the operating frequency of a power cell in accordance with the present disclosure is not limited to any particular frequency, and may range, for example, from about 2.4 GHz to about 10 GHz while remaining within the scope of the present disclosure. Although, in the current embodiment, the input/output impedances of the power cell are approximately 50Ω, the value of the input and/or output impedance can be adjusted to suit any desirable applications while remaining within the scope of the present disclosure. For example, while the disclosed power cell is used to couple between coaxial cable(s), the value of the input/output impedance may be adjusted to be approximately 75Ω.

Figure 2:
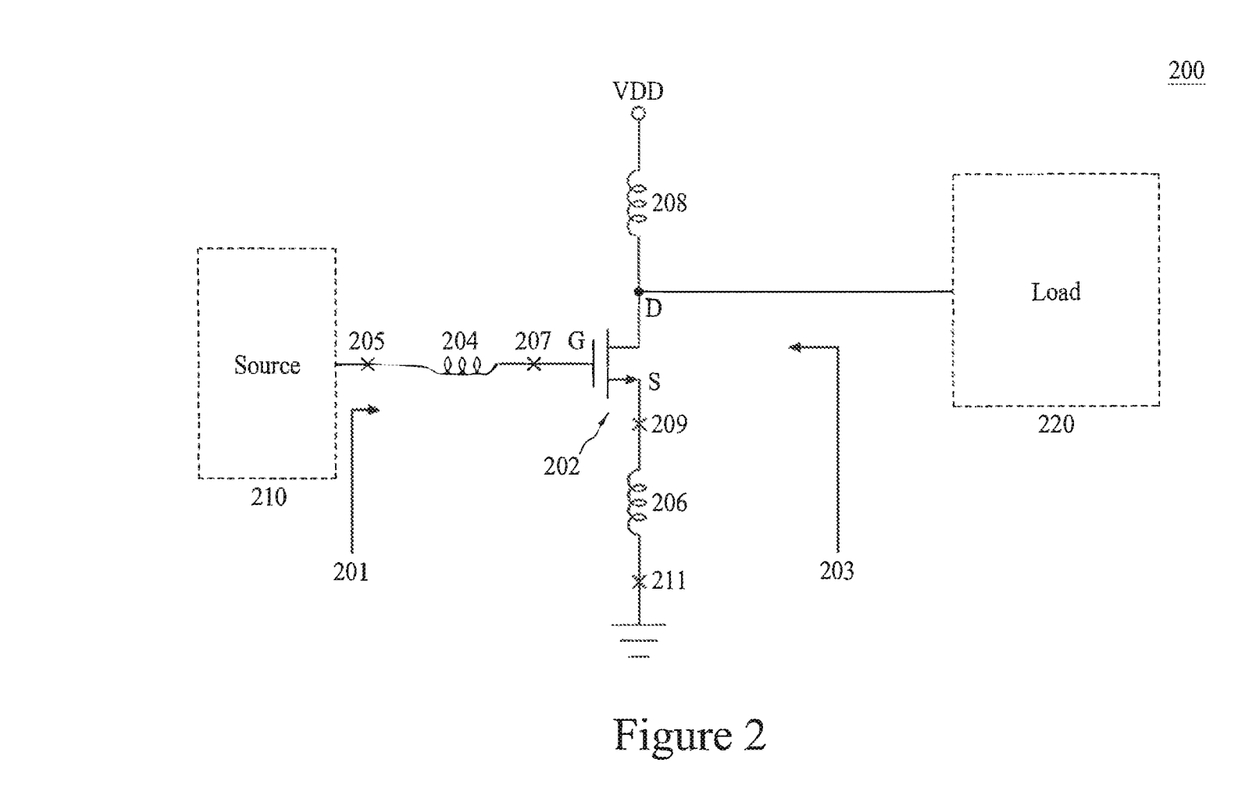
FIG. 2 illustrates an exemplary schematic diagram of a power cell in accordance with some embodiments.

FIG. 2 illustrates an exemplary diagram of a novel power amplifier/power cell 200 in accordance with various embodiments. In the illustrated embodiment of FIG. 2, the power cell 200 includes a main transistor 202, a first inductor 204 coupled between a gate of the transistor 202 and an input signal source 210, a second inductor 206 coupled between a source of the transistor 202 and ground, and a third inductor 208 coupled between a drain of the transistor 202 and a supplied voltage $V_{DD}$. As illustrated, the power cell 200 is coupled to the input signal source 210 through the inductor 204 and to a load 220 at the drain of the transistor 202. In this specific embodiment, the power cell 200 is coupled to the input signal source 210 and the load 220 without a matching circuit. In some embodiments, the transistor 202 is a MOSFET while in some other embodiments, the transistor 202 may be implemented as a silicon-on-insulator (SOI) transistor and/or a high-electron-mobility field-effect-transistor (HEMFET). As referred to hereinafter, the term MOSFET refers to a metal-oxide-semiconductor field-effect transistor used for amplifying or switching electronic signals.

As shown in the example of FIG. 2, a MOSFET 202 has a source, a gate, and a drain (terminal/node) as its contacts for connection with other transistors or devices (e.g., a supply voltage, an input signal source, a load, etc.). In some embodiments, the MOSFET 202 is an n-type MOSFET. However, in some embodiments, the MOSFET 202 may include a p-type MOSFET and/or the MOSFET 202 may include more than one transistor (e.g., a complementary MOSFET) while remaining within the scope of the present disclosure.

In some embodiments, the MOSFET 202 may be a nanoscale transistor. By utilizing a nanoscale transistor (e.g., about 16 nanometers in node length) as the MOSFET 202, an output impedance matching circuit is not required to reach an output impedance (203) of about 50Ω, which is very different from conventional power amplifiers as described above. More specifically, the MOSFET 202 includes a parasitic capacitor across the drain and source of the MOSFET 202, and such a parasitic capacitor is resonated with the third inductor 208 while the MOSFET 202 operates at a frequency between about 0.1 GHz to about 100 GHz thus leading to the 50Ω output impedance. Accordingly, by using such a nanoscale MOSFET 202, since the matching circuit is absent, the supply voltage (i.e., $V_{DD}$) may be substantially reduced. For example, in some embodiments, the supply voltage $V_{DD}$ to drive the power cell 200 may be reduced to about 100 millivolt (mV) while the power cell 200 is still able to provide a power output of approximately −8 dBm while consuming as low as 213 microwatts (μW) of static power, as shown in the following table:

|  | One embodiment of this invention | Conventional Power Cells | | |
| --- | --- | --- | --- | --- |
|  | TSMC | (1) | (2) | (3) |
| $V_{DD}$ (mV) | 100 | 680 | 1,000 | 1,200 |
| PAE (%) | 39 | 45 | 22 | 45 |
| $P_{out}$ (dBm) | −8 | 10.9 | −2 | 0 |
| Gain (dB) | 6.5 | — | — | 10 |
| $P_{DC}$ (μW) | 213 | 26,000 | 2,900 | 2,200 |
| Class | B | B | D | D |
| Technology | 16 nm | 65 nm | 40 nm | 55 nm |

In the above table, various performance characteristics of a power cell in accordance with an embodiment of the present invention are compared with three conventional power cells. In the table, "PAE" refers to power-added efficiency of the power cell; "Gain" is the power gain of the power cell; "$P_{out}$" refers to the output power of the power cell; "PDC" refers to the static power consumption of the power cell; "Class" means which type of power amplifier (e.g., Class A, Class B, Class D, Class AB, etc.) being used by the power cell; "Technology" refers to a node length of a transistor in the power cell.

Referring again to FIG. 2, the inclusion of the inductor 204 coupled to the gate of the MOSFET 202 and the inductor 206 coupled to the source of the MOSFET 202 in the power cell 200 provides a value of the input impedance (201) of the power cell 200 of approximately 50Ω, in accordance with some embodiments. Providing an input impedance of the power cell 200 of approximately 50Ω provides a variety of advantages such as enabling a maximum amount of power transfer from the input signal source 210 to the power cell 200. In some further embodiments, the inductors 204 and 206 may be magnetically coupled with each other to form a transformer with a coupling ratio (k) between about 0 to about 1. Still in some further embodiments, the inductors 204 and 206 may be each formed as a conductive coil, separately from each other, and disposed over the MOSFET 202 (i.e., inductors 204 and 206 are not magnetically coupled to each other), or formed as two conductive coils that are overlapped with each other, and formed over the MOSFET 202 (i.e., inductors 204 and 206 are magnetically coupled to each other and form a transformer). That is, in some embodiments, regardless of the inductors 204 and 206 being magnetically coupled with each other or magnetically decoupled from each other, the inductors 204 and 206 are formed in one or more superimposed layers over the MOSFET 202 and such superimposed layers are different layers from the MOSFET 202. Details of the conductive coils of the inductor 204 and 206 will be described in further detail below in connection with the exemplary layouts of FIGS. 3A, 3B, and 3C, in accordance with various embodiments.

In some embodiments, the inductor 204 and the inductor 206 may each have an inductance Lg and Ls, respectively. When the inductors 204 and 206 are not coupled with each other, the input impedance 201 may be expressed as, Ls×Gm/Cgs+jω×(Lg+Ls−Cgs), where Gm is the transconductance of the MOSFET 202, Cgs is the gate-to-source capacitance of the MOSFET 202, and co is the operation frequency of the MOSFET 202. When the inductors 204 and 206 are coupled with each other, the input impedance 201 may be expressed as, (Ls+k√(Lg×Ls)×Gm/Cgs)+jω×((Lg+Ls+2k√(Lg×Ls))−Cgs), where k is the coupling coefficient between the inductors 204 and 206 as mentioned above. As shown, regardless of the inductors 204 and 206 being coupled or uncoupled, the input impedance includes a real part (i.e., the part without "j") and an imaginary part (i.e., the part with "j"). The imaginary parts of the input impedance may be cancelled out (i.e., "zero" imaginary part) by selecting the inductance (i.e., Lg and Ls) to match or cancel out Cgs in the imaginary part of the equations provided above.

Figure 3A:
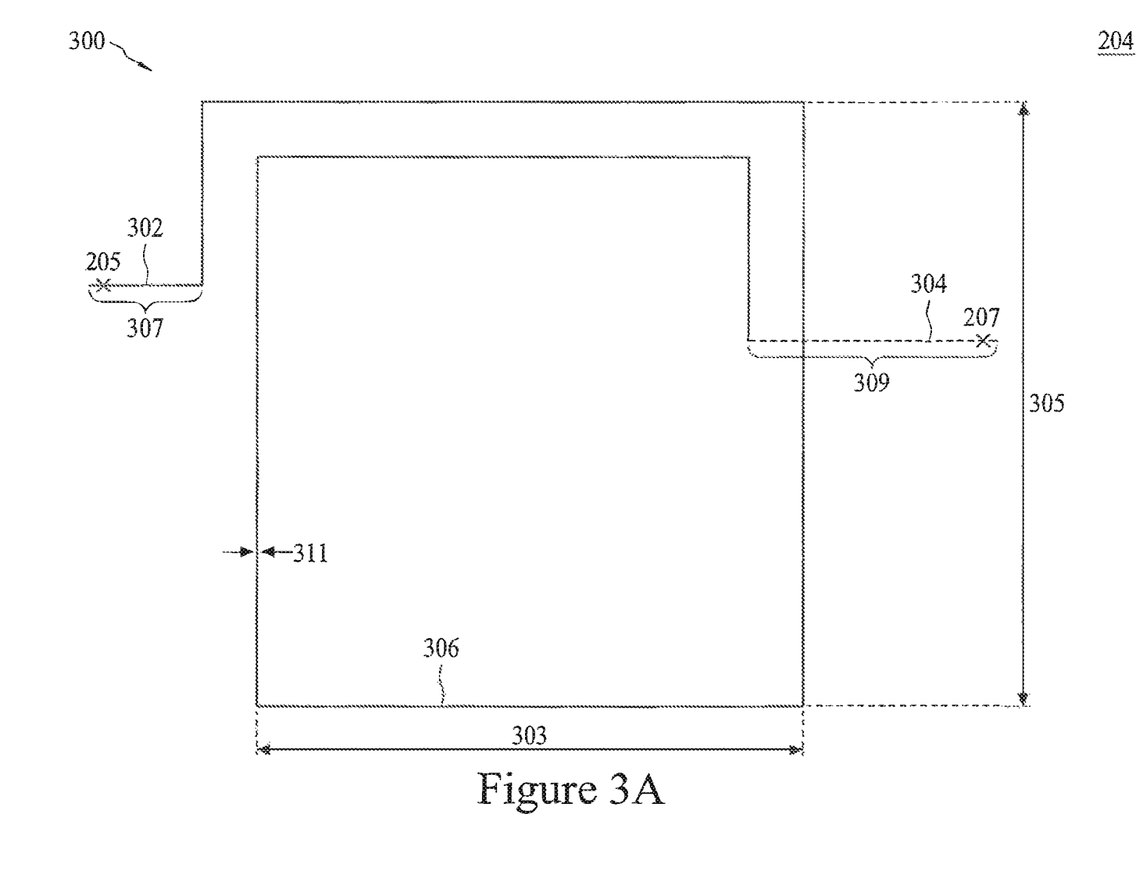
FIG. 3A illustrates an exemplary layout design of an inductor of the power cell of FIG. 2 in accordance with some embodiments.

FIG. 3A illustrates an exemplary layout design of the inductor 204 in accordance with various embodiments. In some embodiments, the inductor 204 includes a conductive coil 300, wherein the conductive coil is formed of metal material and/or polycrystalline (silicon) material. In a specific embodiment, the conductive coil 300 may be formed by routing conductive lines in one or more loops or coils having conductive turns, as shown in FIG. 3A, or the conductive coil 300 may be formed as terminal connections that are overlaid in part by routing a conductive material (e.g., metal material and/or polycrystalline silicon material) in a loop and also up or down through plural integrated circuit layers. In one embodiment, plural helically looped portions are superimposed in different layers.

As shown in FIG. 3A, the conductive coil 300 includes two portions 302 (solid line) and 304 (dotted line) where the first portion 302 is disposed in a first layer and the second portion 304 is disposed in a second layer that is superimposed above or below the first layer, and the first portion 302 and the second portion 304 are connected by an interlayer connection (not shown) such as a through-silicon via, for example. In some embodiments, the conductive coil 300 is disposed over the MOSFET 202 (i.e., the first and the second layers are disposed over the MOSFET 202 and each is a different layer from layer(s) in which the MOSFET 202 is formed).

In some embodiments, the inductor 204 provided by the conductive coil 300 may include two terminals 205 and 207, as shown in FIG. 2. The first terminal 205 may be coupled to a node of the input signal source 210, and the second terminal 207 may be coupled to the gate of the MOSFET 202. Using the illustrated embodiment of the conductive coil 300 in FIG. 3A, the first terminal 205 may be included in the first portion 302. More specifically, the first terminal 205 is formed at an end of the conductive line 306 and an end of a conductive leg 307 (part of the conductive line 306), wherein the conductive leg 307 is not part of the one or more loops or coils having conductive turns. In some embodiments, the first terminal 205 may be connected to a node of the input signal source 210 through a via. Still using the illustrated embodiment of the conductive coil 300 in FIG. 3A, the second terminal 207 may be included in the second portion 304. More specifically, the second terminal 207 is formed at the other end of the conductive line 306 and at an end of a conductive leg 309 (part of the conductive line 306), wherein the conductive leg 309 is not part of the one or more loops or coils having conductive turns. In some embodiments, the second terminal 207 may be connected to the gate of the MOSFET 202 through a via.

Figure 3B:
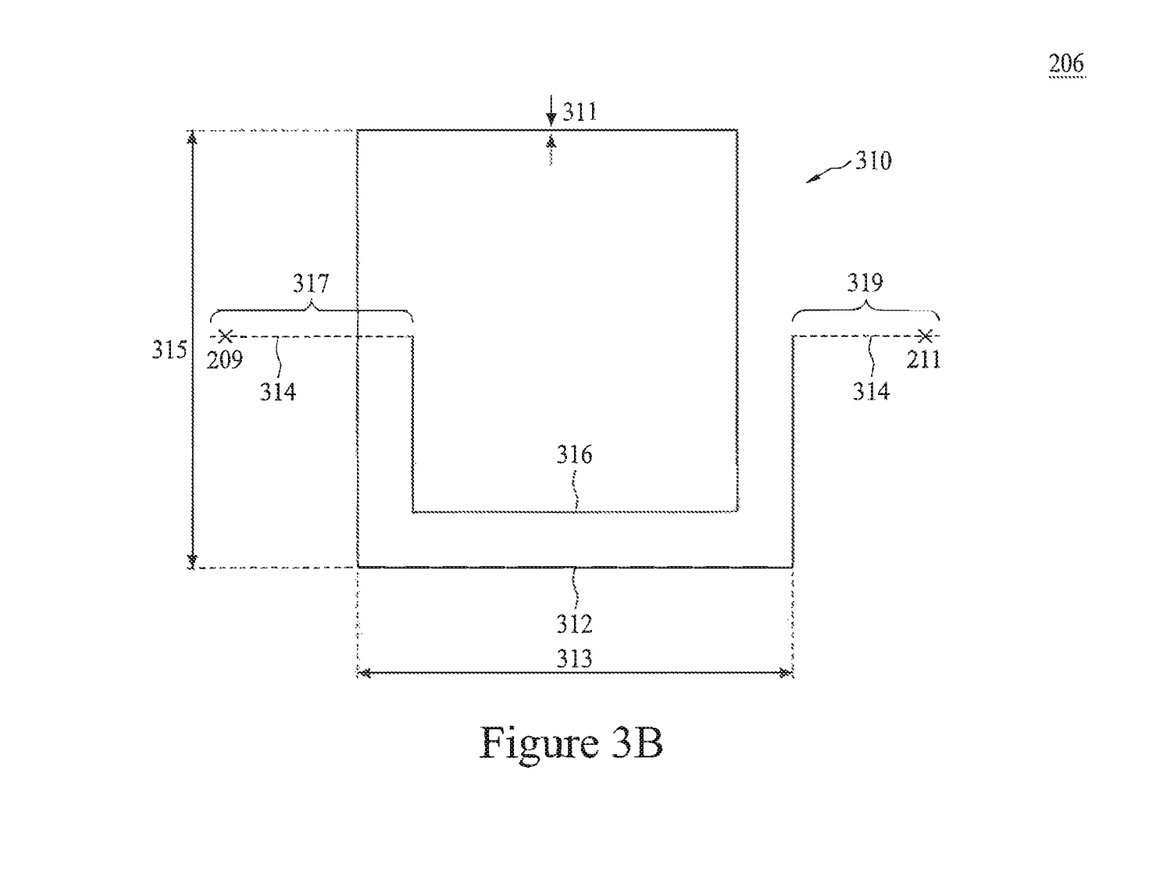
FIG. 3B illustrates an exemplary layout design of an inductor of the power cell of FIG. 2 in accordance with some embodiments.

Referring still to FIG. 3A, in some embodiments, the conductive line 306 of the conductive coil 300 has a line width 301 in the range of about 1 µm to about 10 µm. In some embodiments, from the top view as shown in FIG. 3A, the conductive coil 300 has a width 303 of about 100 µm and a length 305 of about 100 µm. In some embodiments, the conductive coil 300 may provide an inductance value "Lg" in the range of 0.1 nano-Henry to 5 nano-Henry, for example, to the inductor 204, in accordance with some embodiments. 100261 FIG. 3B illustrates an exemplary layout design of the inductor 206 in accordance with various embodiments. In some embodiments, the inductor 206 includes a conductive coil 310, wherein the conductive coil is formed of metal material and/or polycrystalline (silicon) material. Similar to the conductive coil 300, the illustrated embodiment of FIG. 3B provides an example in which the conductive coil 310 is formed as a loop/coil that includes one or more looped conductive lines 316. As shown in FIG. 3B, the conductive coil 310 includes two portions 312 (solid line) and 314 (dotted line) where the first portion 312 is disposed in a third layer and the second portion 314 is disposed in a fourth layer that is superimposed above or below the third layer, and the first portion 312 and the second portion 314 are connected by an interlayer connection (e.g., a through-silicon via). In some embodiments, the conductive coil 310 is disposed over the MOSFET 202 (i.e., the third and the fourth layers are disposed over the MOSFET 202 and each is a different layer from layer(s) in which the MOSFET 202 is formed) and the first, second, third, and fourth layer are different from each other.

In some embodiments, the inductor 206 provided by the conductive coil 310 may include two terminals 209 and 211, as shown in FIG. 2. The first terminal 209 may be coupled to the source of the MOSFET 202, and the second terminal 211 may be coupled to ground. Using the illustrated embodiment of the conductive coil 310 in FIG. 3B, the first terminal 209 may be included in the second portion 314. More specifically, the first terminal 209 is formed at an end of the conductive line 316 and an end of a conductive leg 317 (part of the conductive line 316), wherein the conductive leg 317 is not part of the one or more loops or coils having conductive turns. In some embodiments, the first terminal 209 may be connected to the source of the MOSFET 202 through a via.

Still using the illustrated embodiment of the conductive coil 310 in FIG. 3B, the second terminal 211 may be included in the second portion 314 as well. More specifically, the second terminal 211 is formed at the other end of the conductive line 316 and an end of a conductive leg 319 (part of the conductive line 316), wherein the conductive leg 319 is not part of the one or more loops or coils having conductive turns. In some embodiments, the second terminal 211 may be connected to ground through a via.

In a specific embodiment, the conductive line 316 of the conductive coil 310 has a line width 311 in the range of about 1 µm to about 10 µm; the conductive coil 310, from the top view as shown in FIG. 3B, has a width 313 of about 100 µm and a length 315 of about 100 µm. In some embodiments, the conductive coil 310 may provide an inductance value "Ls" in the range of about 0.1 nano-Henry to about 5 nano-Henry to the inductor 206, in accordance with some embodiments. As described above, the imaginary parts of the input impedance may be cancelled out (i.e., "zero" imaginary part) by selecting the inductance values of Lg and Ls to match or cancel out Cgs in the imaginary part of the uncoupled equation provided above. Further, by selecting the inductance values of Lg and Ls, the real part of the input impedance (i.e., Ls×Gm/Cgs) of the power cell 200 may be tuned to be about 50Ω, for example. As such, without coupling an input impedance matching circuit between the input of the power cell 200 and the output of the input signal source 210, the input impedance of the power cell 200 can still be tuned to be about 50Ω, for example.

Figure 3C:
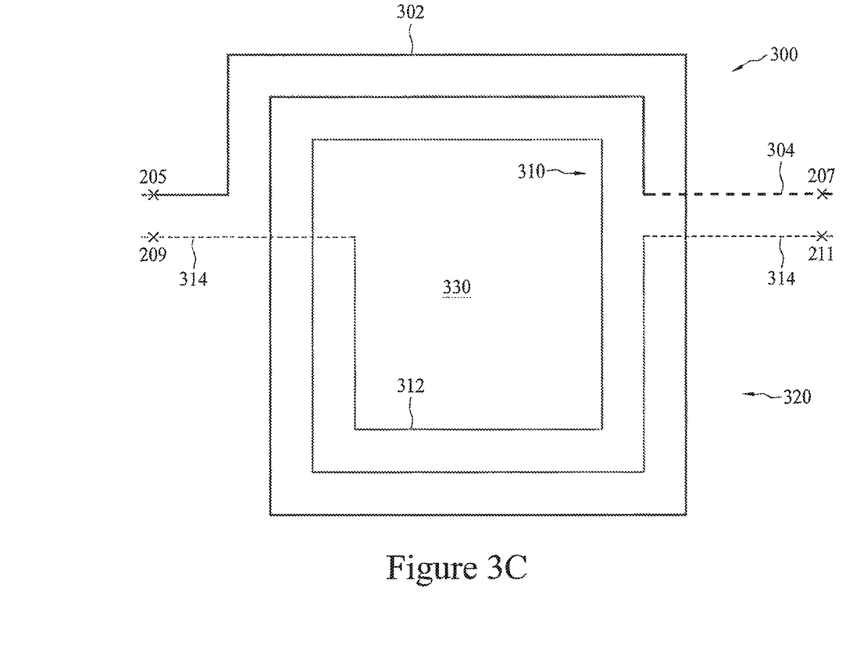
FIG. 3C illustrates an exemplary layout design of two coupled inductors of the power cell of FIG. 2 of in accordance with some embodiments.

FIG. 3C illustrates an exemplary layout design of the inductors 204 and 206 in accordance with various embodiments. As illustrated in FIG. 3C, the conductive coil 300 of the inductor 204 and the conductive coil 310 of the inductor 206 are overlapped with each other so as to form a transformer 320. In this specific embodiment, the conductive coils 300 and the 310 may occupy an overlapped lumen 330. For illustration purpose, the conductive coil 300 is shown in a thicker line to differentiate from the conductive coil 310. Since the conductive coils may each include plural portions in different layers (e.g., 302, 304, 312, and 314), such a transformer 320 may be formed across a plurality of layers (e.g., integrated circuit layers) over the MOSFET 202. For example, the first portion 302 (the thick and solid line) of the conductive coil 300 may be disposed in a first layer, the second portion 304 (the thick and dotted line) of the conductive coil 300 may be disposed in a second layer, the first portion 312 (the thin and solid line) of the conductive coil 310 may be disposed in the first layer same as the first portion 302 of the conductive coil 300, and the second portion 314 (the thin and dotted line) of the conductive coil 310 may be disposed in the second layer same as the second portion 304 of the conductive coil 300, wherein the first layer is different from and superimposed either above or below the second layer. In some embodiments, the terminals 205 and 207 of the conductive coil 300 of the inductor 204 are respectively illustrated in FIG. 3C; the terminals 209 and 211 of the conductive coil 310 of the inductor 206 are respectively illustrated in FIG. 3C. In the illustrated embodiments of FIG. 3C, the terminal 205 may be formed in the above-mentioned first layer while the terminals 207, 209, and 211 are formed in the second layer that is different from and superimposed either above or below the first layer.

As described above, the imaginary parts of the input impedance may be cancelled out (i.e., "zero" imaginary part) by selecting the inductance values of Lg and Ls to match the Cgs in the imaginary part of the coupled equation provided above. For example, by selecting the inductance values of Lg and Ls, and the coupling coefficient k, the real part of the input impedance (i.e., Ls+k√(Lg×Ls)×Gm/Cgs) of the power cell 200 may be tuned to be about 50Ω and the imaginary part of the input impedance (i.e., (Lg+Ls+2k√(Lg×Ls))−Cgs) is about zero. As such, without coupling an input impedance matching circuit between the input of the power cell 200 and the output of the input signal source 210, the input impedance of the power cell 200 can still be tuned to be about 50Ω, for example.

Figure 4:
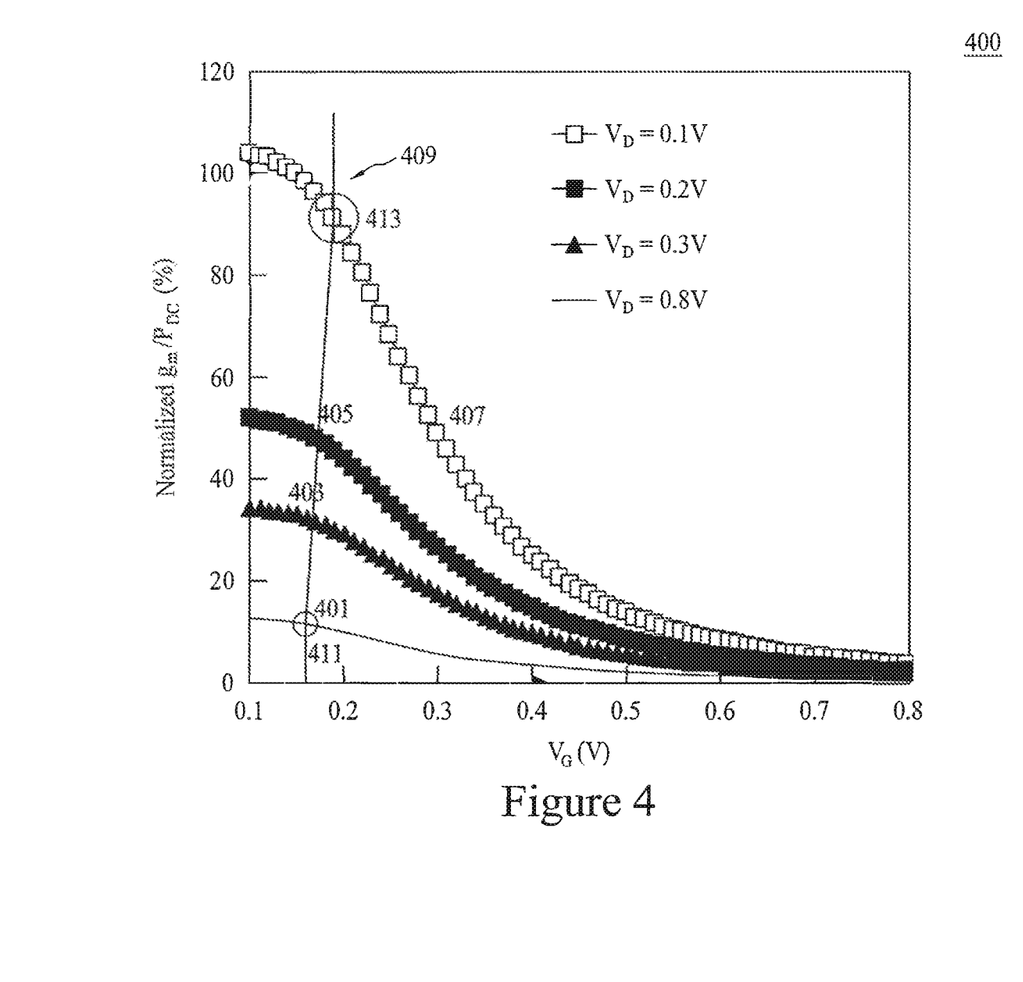
FIG. 4 illustrates an exemplary diagram showing various characteristics of the MOSFET of FIG. 2 in accordance with various embodiments.

FIG. 4 shows an exemplary diagram 400 illustrating various improved characteristics of the MOSFET 202 in accordance with various embodiments. The x-axis of the diagram 400 represents a voltage applied to the gate of the MOSFET 202; the y-axis of the diagram 400 represents a percentage of improved power efficiency of the MOSFET 202 (defined as, normalized transconductance of the MOSFET 202 at a given gate voltage over the static power at the given gate voltage). In the diagram 400, lines 401, 403, 405, and 407 each represents a trend of the percentage of improved power efficiency versus a varying gate voltage (from 0.1 volts to 0.8 volts) when the MOSFET 202 is biased at four different drain voltages: 0.1 volts, 0.2 volts, 0.3 volts, and 0.8 volts, respectively. As shown, when the drain of the MOSFET 202 is biased at 0.8 volts (line 401), decreasing gate voltage from 0.8 volts to 0.15 volts increases power efficiency from approximately 1% to approximately 12%. When the drain of the MOSFET 202 is biased at 0.3 volts (line 403), decreasing gate voltage from 0.8 volts to 0.15 volts increases power efficiency from approximately 1% to approximately 30%. When the drain of the MOSFET 202 is biased at 0.2 volts (line 405), decreasing gate voltages from 0.8 volts to 0.15 volts increases power efficiency from approximately 1% to approximately 50%. When the drain of the MOSFET 202 is biased at 0.1 volts (line 407), decreasing gate voltages from 0.8 volts to 0.15 volts increases power efficiency from approximately 1% to approximately 100%. Further, when the gate voltage of the MOSFET 202 is biased and fixed at 0.15 volts, illustrated as line 409, decreasing drain voltages from 0.8 volts to 0.1 volts (i.e., from intersection 411 to intersection 413) increases power efficiency from approximately 12% to approximately 100%.

Figure 5:
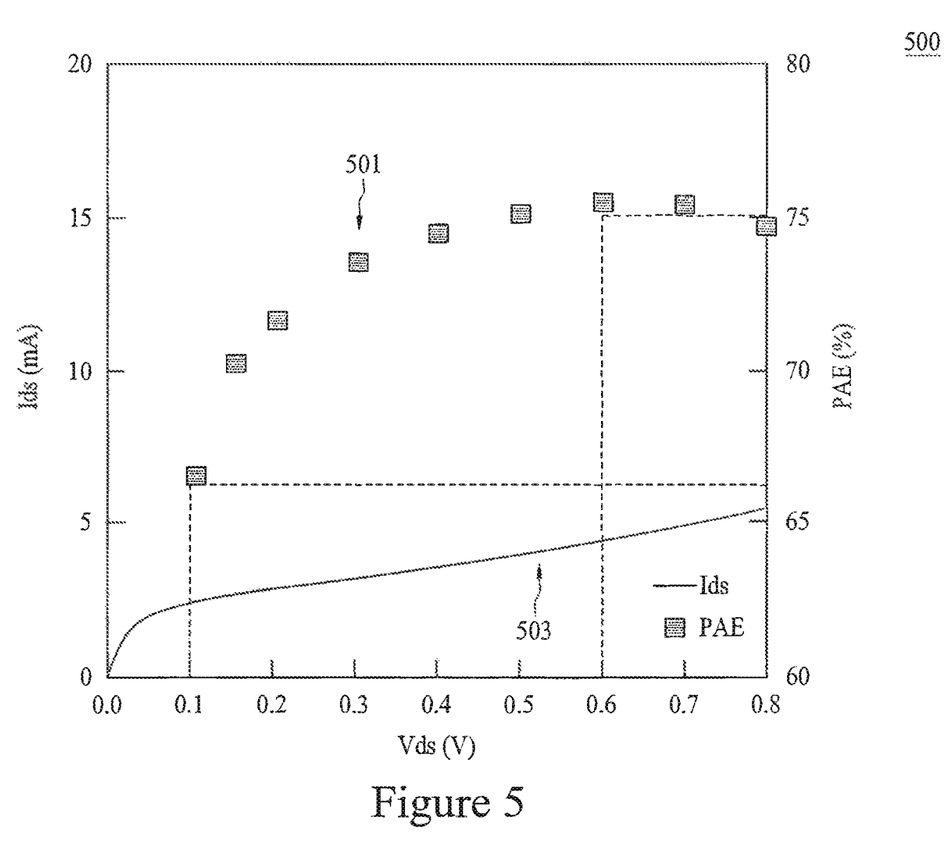
FIG. 5 illustrates an exemplary diagram showing the change of PAE of the MOSFET of FIG. 2 with respect to varying voltages applied to the drain of the MOSFET of FIG. 2 in accordance with various embodiments.

FIG. 5 shows an exemplary diagram 500 illustrating the change of PAE with respect to varying voltages applied to the drain of the MOSFET 202 in accordance with various embodiments. The x-axis of the diagram 500 represents the voltage applied to the drain of the MOSFET 202; the left y-axis of the diagram 500 represents a source-to-drain current level of the MOSFET 202; the right y-axis of the diagram 500 represents the PAE of the MOSFET 202. Each discrete square dot 501 represents the PAE of the MOSFET 202 when the MOSFET 202 is biased at a different drain voltage; line 503 represents the trend of the source-to-drain current level with the varying drain voltage (0 to 0.8 volts) of the MOSFET 202. Dots 501 show that the PAE reaches a maximum value and a minimum value at drain voltages of 0.6 volts and 0.1 volts, respectively. More particularly, the MOSFET 202 presents an decreasing PAE from about 76% to about 66% (i.e., about 10% drop of PAE) with the drain voltages decreasing from 0.6 volts to 0.1 volts. Generally, percentage drop of PAE in a PA cell is approximately similar as percentage of drop of PAE observed in the main transistor of the PA cell, and the PAE of the PA cell is lower than the PAE of the main transistor of the PA cell. That is, if the MOSFET 202 is used as a main transistor in a conventional PA cell (i.e., a PA cell includes an output/input impedance matching circuits), PAE of the conventional PA cell will drop from about 40%~50% to about 30% while the drain supplied voltage of the MOSFET decrease from about 0.6 volts to about 0.1 volts. However, as shown in the above-provided table, the disclosed PA cell 200 using the MOSFET 202 as the main transistor provides the PAE of about 39% while the MOSFET is supplied at 0.1 volts. This substantially higher PAE of the power cell while the power cell is under low operation voltage provides another of a variety of advantages over the conventional power cells especially when the power cell is designated to be used in a low-power application.

In an embodiment, a power amplifier (PA) cell is disclosed. The PA cell is coupled to an input signal source an a load, and includes a transistor coupled to the load; a first inductor coupled to a gate of the transistor; and a second inductor coupled to a source of the transistor, wherein the first inductor and the second inductor each includes a first conductive coil and a second conductive coil, respectively, having first and second inductance values, respectively, such that the power cell is coupled to the input signal source without an input impedance matching circuit disposed between the gate of the transistor and the input signal source, and without an output impedance matching circuit disposed between a drain of the transistor and the load.

In another embodiment, a power amplifier (PA) cell is disclosed. The PA cell is coupled to an input signal source an a load, and includes a transistor coupled to the load; a first inductor coupled to a gate of the transistor; and a second inductor coupled to a source of the transistor, wherein the first inductor and the second inductor each includes a first conductive coil and a second conductive coil, respectively, having first and second inductance values, respectively, wherein the first and the second conductive coil are magnetically coupled to each other thereby forming a transformer, such that the PA cell is coupled to the input signal source without an input impedance matching circuit disposed between the gate of the transistor and the input signal source, and without an output impedance matching circuit disposed between a drain of the transistor and the load.

Yet in another embodiment, a power amplifier (PA) cell is disclosed. The PA cell is coupled to an input signal source an a load, and includes a transistor coupled to the load; a first inductor coupled to a gate of the transistor; and a second inductor coupled to a source of the transistor, wherein the first inductor and the second inductor each includes a first conductive coil and a second conductive coil, respectively, having first and second inductance values, respectively, wherein the first and the second conductive coil are magnetically decoupled from each other, such that the PA cell is coupled to the input signal source without an input impedance matching circuit disposed between the gate of the transistor and the input signal source, and without an output impedance matching circuit disposed between a drain of the transistor and the load.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power amplifier (PA) cell coupled to an input signal source, comprising:
   a single transistor comprising a gate, a drain, and a source;
   a resonating inductor directly coupled to the drain of the single transistor, wherein the resonating inductor is configured to resonate at an operating frequency with a parasitic capacitance across the drain and the source of the single transistor to match an output impedance;
   a first inductor directly coupled to the source of the single transistor;
   a terminal between the gate of the single transistor and the input signal source, wherein the terminal is impedance matched with the input signal source; and
   a second inductor coupled to the gate of the single transistor.

2. The PA cell of claim 1, wherein the first inductor and the second inductor each include a first conductive coil and a second conductive coil, respectively, having first and second inductance values, respectively, such that the PA cell is coupled to the input signal source without an input impedance matching circuit disposed between the gate of the single transistor and the input signal source, and without an output impedance matching circuit disposed between the drain of the single transistor and a load.

3. The PA cell of claim 2, wherein the first conductive coil includes a first portion that is disposed in a first layer over the single transistor and a second portion that is disposed in a second layer over the single transistor, the first layer being different from the second layer.

4. The PA cell of claim 2, wherein the second conductive coil includes a first portion that is disposed in a first layer over the single transistor and a second portion that is disposed in a second layer over the single transistor, the first layer being different from the second layer.

5. The PA cell of claim 2, wherein the first and the second conductive coils are magnetically coupled with each other to form a transformer.

6. The PA cell of claim 2, wherein the first conductive coils include a first portion and the second conductive coils include a first portion, wherein the first portions of the first and second conductive coils are disposed in a first layer over the single transistor.

7. The PA cell of claim 6, wherein the first conductive coils includes a second portion and the second conductive coils includes a second portion, wherein the second portions of the first and second conductive coils are disposed in a second layer over the single transistor, the first layer being different from the second layer.

8. The PA cell of claim 1, wherein inductance values of the first and second inductors provide an input impedance of a power cell of about 50 Ohms.

9. The PA cell of claim 1, wherein an inductance value of the second inductor is about 0.1 nano-Henry to about 5 nano-Henry and an inductance value of the first inductor is about 0.1 nano-Henry to about 5 nano-Henry.

10. A power amplifier (PA) cell, comprising:
    a single transistor comprising a gate, a drain, and a source;
    a resonating inductor directly coupled to the drain of the single transistor, wherein the resonating inductor is configured to resonate at an operating frequency with a parasitic capacitance across the drain and the source of the single transistor to match an output impedance;
    a first inductor directly coupled to the source of the single transistor; and
    a second inductor coupled to the gate of the single transistor.

11. The PA cell of claim 10,
    wherein the first inductor and the second inductor each include a first conductive coil and a second conductive coil, respectively, having first and second inductance values, respectively, wherein the first and the second conductive coil are magnetically coupled to each other thereby forming a transformer, such that the PA cell is coupled to an input signal source without an input impedance matching circuit disposed between the gate of the single transistor and the input signal source, and without an output impedance matching circuit disposed between the drain of the single transistor and a load.

12. The PA cell of claim 11, wherein the first conductive coil includes a first portion that is disposed in a first layer over the single transistor and a second portion that is disposed in a second layer over the single transistor, the first layer being different from the second layer.

13. The PA cell of claim 12, wherein the second conductive coil includes a first portion that is disposed in the first layer over the single transistor and a second portion that is disposed in the second layer over the single transistor.

14. The PA cell of claim 11, wherein, from a top view, the first conductive coil and the second conductive coil occupy an overlapped lumen.

15. The PA cell of claim 11, wherein inductance values of the first and second inductors provide an input impedance of a power cell of about 50 Ohm.

16. A circuit, comprising:
- an input signal source;
- a single transistor comprising a gate, a drain, and a source;
- a resonating inductor directly coupled to the drain of the single transistor, wherein the resonating inductor is configured to resonate at an operating frequency with a parasitic capacitance across the drain and the source of the single transistor to match an output impedance;
- a first inductor directly coupled to the source of the single transistor;
- a terminal between the gate of the single transistor and the input signal source, wherein the terminal is impedance matched with the input signal source; and
- a second inductor coupled to the gate of the single transistor.

17. The circuit of claim 16, wherein the single transistor is coupled to a load.

18. The circuit of claim 16, wherein the resonating inductor is coupled between the drain of the single transistor and a supplied voltage.

19. The circuit of claim 16, wherein an inductance value of the resonating inductor is about 0.1 nano-Henry to about 5 nano-Henry.

20. The circuit of claim 16, wherein the first inductor and the second inductor each include a first conductive coil and a second conductive coil, respectively, having first and second inductance values, respectively, such that the circuit is coupled to the input signal source without an input impedance matching circuit disposed between the gate of the single transistor and the input signal source, and without an output impedance matching circuit disposed between the drain of the single transistor and a load.

* * * * *